United States Patent
Eghan et al.

(10) Patent No.: US 7,064,450 B1
(45) Date of Patent: Jun. 20, 2006

(54) SEMICONDUCTOR DIE WITH HIGH DENSITY OFFSET-INLINE BOND ARRANGEMENT

(75) Inventors: Abu K. Eghan, San Jose, CA (US); Richard C. Li, Cupertino, CA (US); Xin X. Wu, Fremont, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/842,756

(22) Filed: May 11, 2004

(51) Int. Cl.
*H01L 23/48* (2006.01)

(52) U.S. Cl. ............... 257/786; 257/48; 257/692; 257/773; 257/775; 257/780

(58) Field of Classification Search .............. 257/48, 257/690, 692, 773, 775, 780, 784, 786; 438/18, 438/612
See application file for complete search history.

(56) References Cited

U.S. PATENT DOCUMENTS

| | | | |
|---|---|---|---|
| 5,506,499 A | | 4/1996 | Puar |
| 5,554,940 A | * | 9/1996 | Hubacher ............... 324/765 |
| 5,635,424 A | | 6/1997 | Rostoker et al. |
| 5,923,047 A | * | 7/1999 | Chia et al. ............... 257/48 |
| 6,078,100 A | * | 6/2000 | Duesman et al. ........... 257/690 |
| 6,359,342 B1 | * | 3/2002 | Yuan et al. ............... 257/784 |
| 6,380,555 B1 | | 4/2002 | Hembree et al. |
| 6,534,853 B1 | * | 3/2003 | Liu et al. ............... 257/692 |
| 6,617,181 B1 | | 9/2003 | Wright et al. |
| 6,630,837 B1 | | 10/2003 | Wark |
| 6,713,881 B1 | * | 3/2004 | Umehara et al. ........... 257/786 |

OTHER PUBLICATIONS

U.S. Appl. No. 10/842,770, filed May 11, 2004, Mardi et al.

* cited by examiner

*Primary Examiner*—Ori Nadav
(74) *Attorney, Agent, or Firm*—E. Eric Hoffman; LeRoy D. Maunu; Justin Liu

(57) ABSTRACT

A pad pattern of a die includes first and second sets of elongated pads. The first set of elongated pads is interleaved with the second set of elongated pads. Each of the elongated pads has a bond pad area and a probe pad. Each bond pad area has a first constant width along a substantial portion thereof. Similarly, each probe pad area has a second constant width along a substantial portion thereof. The first constant width is greater than the second constant width. Each elongated pad in the first set has a first orientation. Similarly, each elongated pad in the second set has a second orientation, opposite the first orientation.

13 Claims, 7 Drawing Sheets

SEMICONDUCTOR DIE WITH HIGH DENSITY OFFSET-INLINE BOND ARRANGEMENT

FIELD OF THE INVENTION

The present invention relates to the layout of wire bonding pads on a semiconductor die to achieve high pad density and allow for pad probing.

RELATED ART

The aggressive development of semiconductor technology and the accompanying need for higher device integration has enabled current state of the art chips to integrate entire systems on a single small semiconductor die. The need to provide all the possible interconnections to these feature-laden chips remains a challenge in the packaging industry, as all the required pads compete for the small peripheral space around the die. The interconnection issue has become even more challenging as these chips are utilizing newer technology nodes to achieve smaller die sizes that are pad limited. Several approaches have been used to address these pad limitation issues.

Flip-chip interconnection technology is one possible way to increase the available bond pad space. In this scheme, the connecting pads are distributed over the entire surface of the chip. While flip-chip technology has been helpful in increasing the number of bond pads that can be located on a chip, this technology is inflexible and is often too costly to implement in cost sensitive products.

As a result, wirebonding technology continues to be used for many devices. In wirebonding, small wires are attached to bond pads located around the peripheral space of a die. These small wires are attached using established bonding methods, such as thermosonic gold wirebonding. FIG. 1 is a block diagram illustrating bond pad areas 101–104 located around the peripheral space of a conventional die 100.

Various bond pad schemes have been employed to provide for high-density wirebonds. Traditional wirebond pads have implemented square, rectangular and octagonal shapes. Most of these bond pad schemes have addressed the pad pitch and the pad opening area as primary design elements. For any given wire size, there is a corresponding pitch and an effective pad opening area that can be used with prevailing state of the art bonding. As the pitch is reduced, the wire size diameter must also be reduced to achieve similar yield results.

FIG. 2 is a block diagram illustrating a simple linear or in-line arrangement of rectangular pads 201–203, which can be located, for example, in bond pad areas 101–104 of FIG. 1. Note that many more bond pads (not shown) are typically located in bond pad area 101. Bond pads 201–203 each exhibit a height (H) and a width (W). Each edge of bond pads 201–203 exhibits a passivation overlap (B). Passivation overlap is the amount of passivation material that covers the periphery of the metal pad. A minimum overlap is typically required by the fab house to create a passivation defined opening over the metal pad. A minimum metal-to-metal spacing (A) exists between adjacent pads 201–203. The pitch (P) of this single row in-line arrangement is designated by the width of the repeating pattern exhibited by the bond pads and the associated spacing (i.e., P=W+2B+A). When W is equal to H, we have a typical single row square pad arrangement.

Rostaker et al. has disclosed certain non-square pads in U.S. Pat. No. 5,635,424. Rostoker et al. sought to increase bond pad density by using complimentary wedge shaped pads arranged in an alternating fashion and aligned to the wire exit angle for wedge bonding.

FIG. 3 is a block diagram illustrating four complementary wedge shaped pads 301–304. Each of these wedge shaped pads 301–304 has a first width (W1) at one end, a second width (W2) at the other end. Each edge of bond pads 301–304 exhibits an overlap (B). A metal-to-metal minimum spacing (A) exists between adjacent pads 301–304. The pitch (P) is designated by the width of the repeating pattern exhibited by the bond pads and the associated spacing divided by two (i.e., P≅(W1+W2+4B+2A)/2). The arrangement proposed by Rostoker et al. seeks to achieve a higher bond density by aligning the wedge shaped pads with the expected approach angles of the bond wires. The wedge shaped pads 301–304 are therefore not flexible for other types of interconnecting wire bond approaches. Rostoker et al. also do not consider the need for a separate probing area for the described pads.

Multiple row and staggered bond pad arrangements have also been used to improve bond pad density. While staggered bond pad arrangements have worked in many applications, these staggered bond pads consume a substantial portion of the available die area.

FIG. 4 is a block diagram of a traditional staggered bond pad arrangement 400, which includes outer bond pads 401–402 and inner bond pads 403–405. Each of outer bond pads 401–402 has a first width ($W_O$) and a first height ($H_O$). Each of inner bond pads 403–405 has a second width ($W_I$) and a second height ($H_I$). The first and second widths $W_O$ and $W_I$ may or may not be equal. The stagger arrangement is achieved by offsetting the inner row bond pads 403–405 from the outer row bond pads 401–402. In a typical stagger pad arrangement $H_I$ and $H_O$ are equal but they need not be. An offset (S) exists between the inner and outer bond pads. Each edge of bond pads 401–405 exhibits a passivation overlap of (B). A minimum metal-to-metal spacing (A) exists between adjacent bond pads 401–405. The pad connection metal 450 has a width (C).

In the wafer form the chips are usually probed using fine probe tips to determine functionality prior to assembly. Though not all pads may be probed, the ones that are probed typically sustain some metal damage that can interfere with the subsequent bonding operation. This metal damage can lead to premature lifting of the bond pads (especially in fine pitch bonding). Chia et al. address the probe damage issue in U.S. Pat. No. 5,923,047, which provides sacrificial test pads in the scribe line area between adjacent dice on a wafer.

FIG. 5 is a block diagram illustrating adjacent dice 501 and 502 on a wafer 500 in accordance with Chia et al. Dice 501 and 502 include bonding pads 511–517 and 521–527, respectively. Test pads 51–57 are located in the scribing space (adjacent to scribe line 550) between the dice 501 and 502. Alternate test pads are connected with alternate bonding pads on adjacent die, thereby increasing the pitch of adjacent die for testing. After the integrated circuits on dice 501–502 are tested, the wafer is scribed in the scribe space and broken to recover the individual dice. Note that only every other bond pad can be subject to testing in the system of FIG. 5.

It would therefore be desirable to have an improved pad layout. It would further be desirable if this improved pad layout increases the number of bond pads without using too much of the peripheral area of the associated die.

SUMMARY

Accordingly, the present invention provides an improved pad layout arrangement. In accordance with one embodiment, a pad pattern of a die includes a first set of elongated pads and a second set of elongated pads, wherein the first set of elongated pads are interleaved with the second set of elongated pads. Each of the elongated pads in the first and second sets includes a relatively wide bond pad area at one end, and a relatively narrow probe pad area at a second end. In one embodiment, each of the bond pad areas exhibits a first constant width along substantial portions of their length, and each of the probe pad areas exhibits a second constant width along portions of their length. For example, the bond pad areas and probe pad areas can be formed by rectangular shapes, which are joined by a trapezoidal shape. Alternately, the bond pad areas and probe pad areas can be formed by octagonal (or other polygonal) shapes, which are joined by a rectangular shape. In another embodiment, the bond pad areas and the probe pad areas may be formed by circular shapes. These circular shapes may be joined by a rectangular shape.

Each of the elongated pads in the first set is positioned with a first orientation, and each of the elongated pads in the second set is positioned with a second orientation. The second orientation may be a mirror image of the first orientation. For example, the bond pad areas of the first set of elongated pads may be located adjacent to the probe pad areas of the second set of elongated pads (and vice versa).

In one embodiment, the elongated pads of the first and second sets are identical in shape, but may have opposite orientations.

In certain embodiments, a substantially uniform spacing exists between the elongated pads of the first and second sets.

The pad pattern of the present invention allows a higher density of pads to be placed on a die without using the traditional area consuming staggered pad arrangement. In the arrangement of the present invention, the pad structure has separate areas for bonding and probing. The pads are arranged adjacent to each other in a reverse-mirror fashion, thereby allowing maximum packing density, maximum bonding distance between the bond pad centers, and minimum overall die area. A relatively large bond pad area that is undamaged by a probe at the time of the bonding is also made available and allows for good bonding without concern for probe damage.

The present invention provides non-square, non-wedged bond pad shapes. The pad arrangement allows a minimum use of space, and allows the bond pads to be pitched on a denser alternating and zigzag fashion to maximize the pitch while maintaining a relatively large bond pad area. The arrangement also allows an exclusive area for probing the die such that probe marks do not interfere with the bonding process. This improves the chance for good bonding.

The present invention will be more fully understood in view of the following description and drawings.

DETAILED DESCRIPTION

Figure 1:
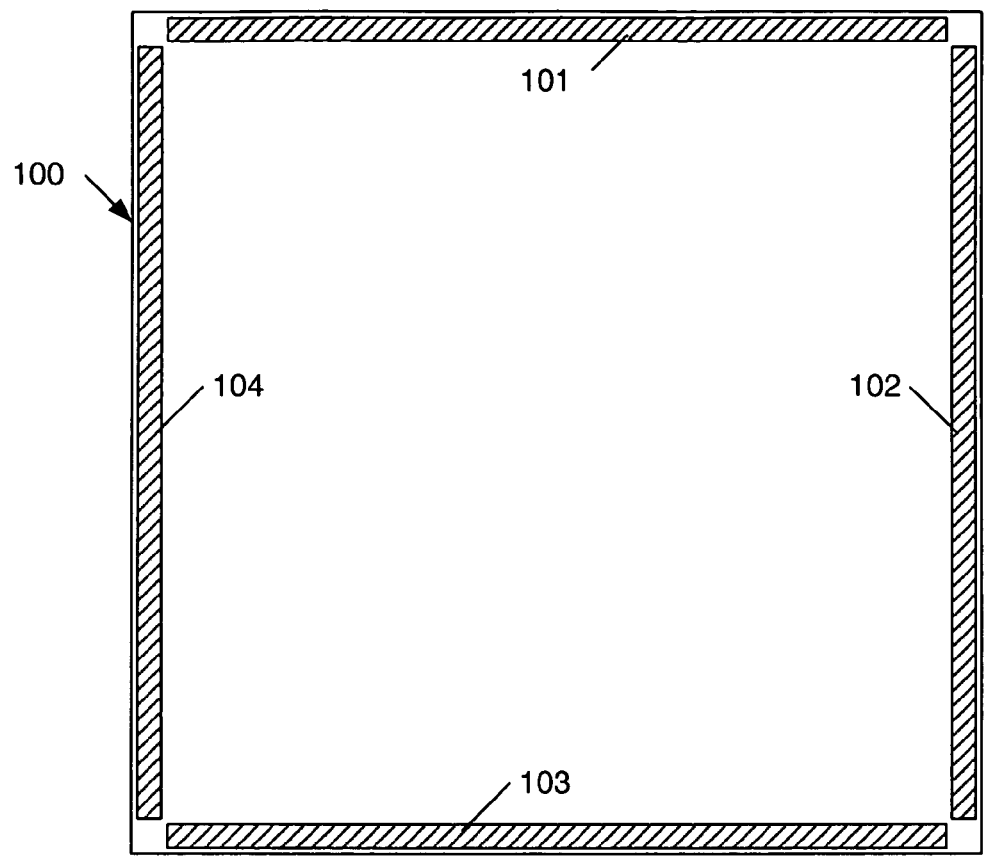
FIG. 1 is a block diagram illustrating bond pad areas located around the perimeter of a conventional die
Figure 2:
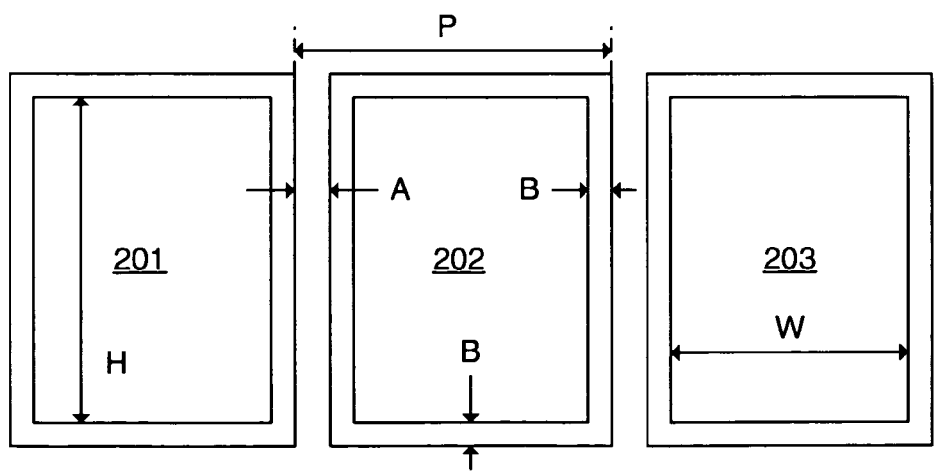
FIG. 2 is a block diagram illustrating a simple linear arrangement of rectangular pads, which can be located, for example, in a bond pad area of FIG. 1.
Figure 3:
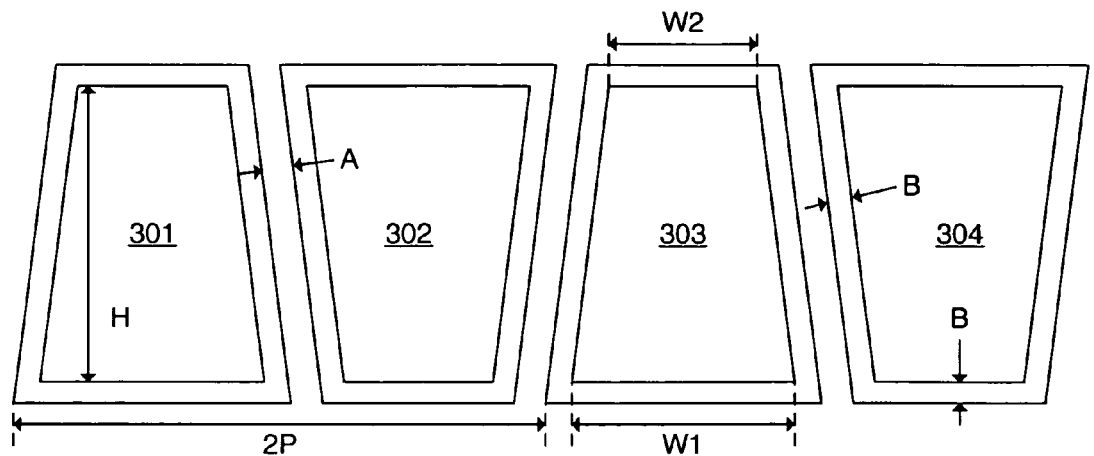
FIG. 3 is a block diagram illustrating complementary wedge shaped pads, which can be located, for example, in a bond pad area of FIG. 1.
Figure 5:
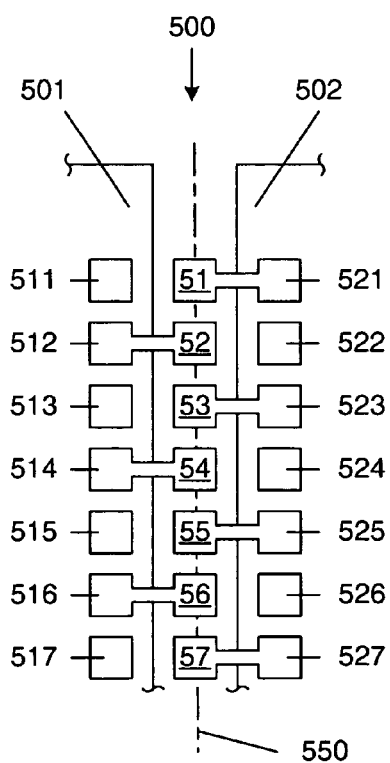
FIG. 5 is a block diagram illustrating conventional bond pads and test pads associated with adjacent dice on a wafer.
Figure 4:
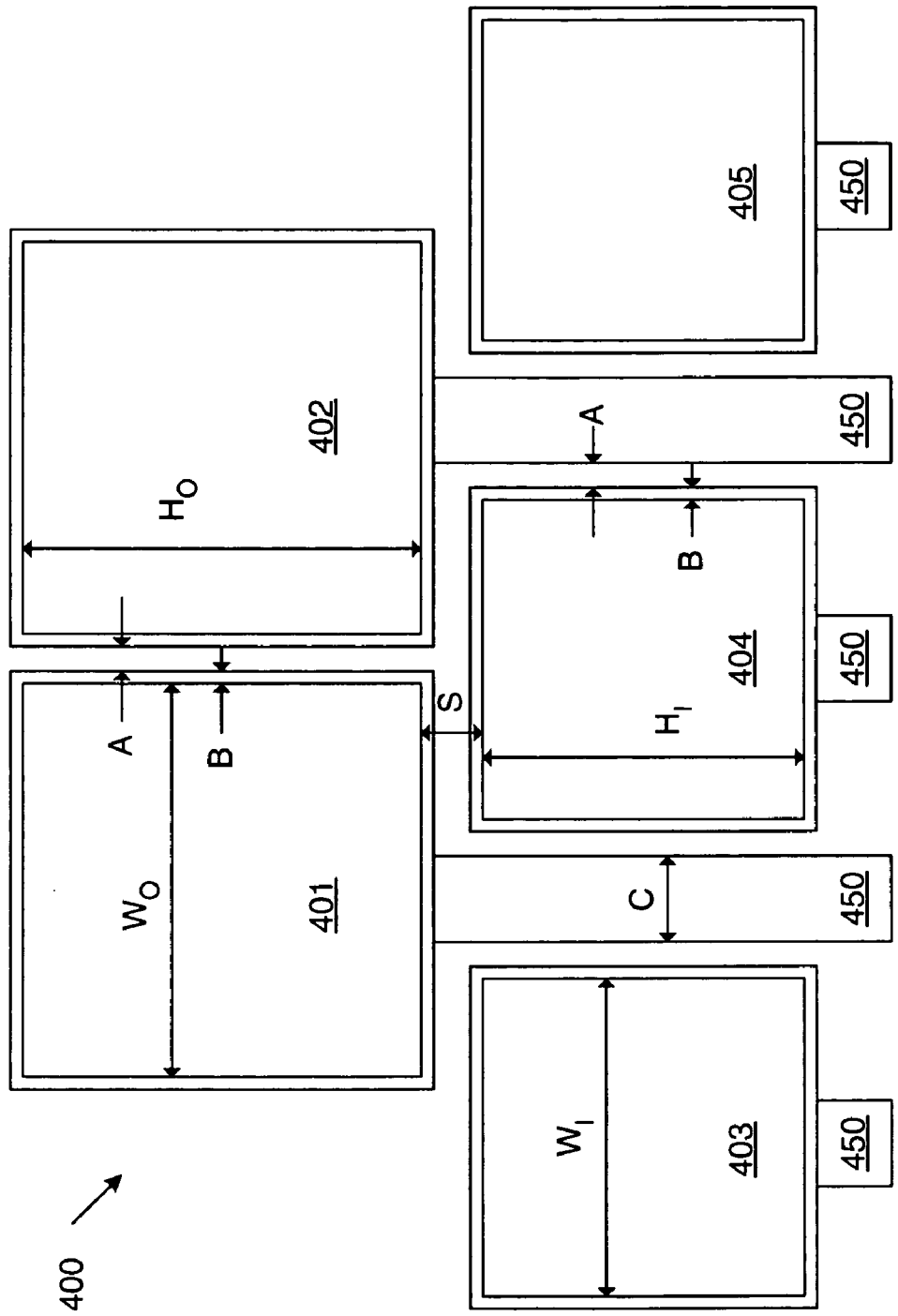
FIG. 4 is a block diagram illustrating conventional 2 row staggered bond pad arrangement, which can be located, for example, in a bond pad area of FIG. 1.

In general, the present invention provides a bond pad/probe pad layout arrangement that results in a relatively tight pitch through the efficient use of space. More specifically, the present invention includes an elongated pad structure having 2 distinct areas: a bond area and a smaller probe area. These two areas on the same die, are adjacent and are electrically connected to one another. Testing is performed by probing the smaller probe area, and bonding is performed at the larger bond area. The elongated pad structure is repeated, with alternating pad structures being reversed, thereby resulting in a minimum metal-to-metal spacing between adjacent pad structures. This configuration results in a relatively tight pitch, when compared to a simple linear arrangement of pads (see, FIG. 2). The alternating pad structure results in bond areas being located adjacent to probe areas, resulting in tighter pitch than was previously possible. The centers of the probe areas form a regular (linear) zig-zag pattern. Similarly, the centers of the bond areas form a regular zig-zag pattern. As a result, the effective pad-to-pad distance is longer than the associated linear distance along the edge of the chip. The effective pad-to-pad distance can be increased by up to about 40% with respect to the corresponding linear distance along the edge of the chip. This configuration allows more pad structures to be placed along a given edge of a chip, or allows the use of larger bond pad opening areas, thereby allowing the use of larger size of bonding wire, and improved bond yields and current carrying capability.

Figure 6:
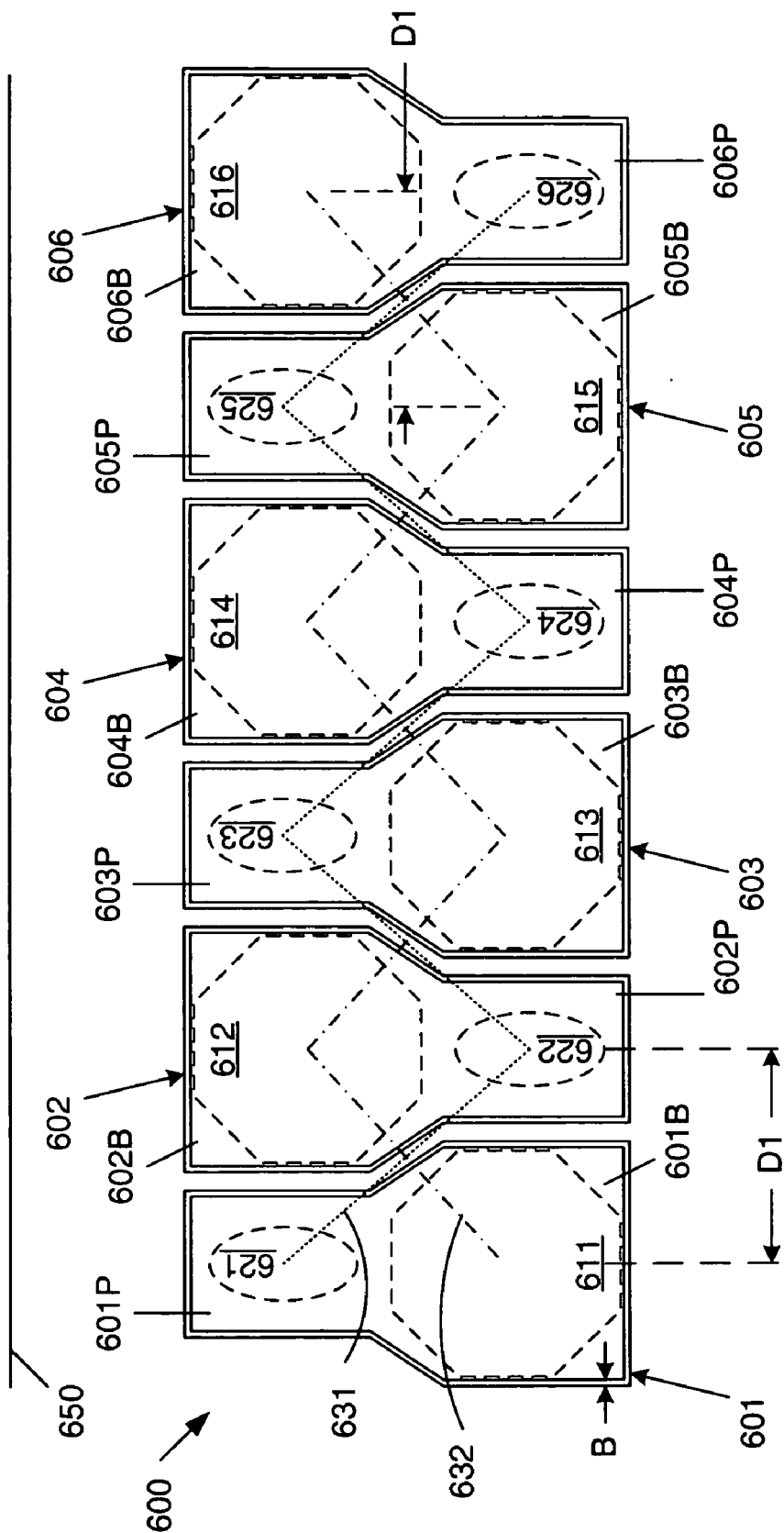
FIG. 6 is a top view of a pattern of elongated bond/probe pads, which implement rectangular bond pad areas and probe pad areas, and are located along a die edge in accordance with one embodiment of the present invention.

FIG. 6 is a top view of a pattern 600 of bond/probe pads 601–606, which are located along die edge 650 in accordance with one embodiment of the present invention. Each of bond/probe pads 601–606 has an elongated structure that includes an associated bond pad area 601B–606B, respectively, and an associated probe pad area 601P–606P, respectively. Bond pad areas 601B–606B may be larger than probe pad areas 601P–606P. For example, each of bond pad areas 601B–606B can have an area of about 50 micron by 50 micron, and each of probe pad areas 601P–606P can have an area of about 35 micron by 35 micron. An overlap "B" exists at the perimeter of each of the bond/probe pads 601–606.

In the described embodiment, each of bond/probe pads 601–606 is formed of a continuous piece of metal, such as aluminum or copper. In addition, bond/probe pads 601–606 all have the same shape. However, a first set of the bond/probe pads 601, 603 and 605 (i.e., the odd numbered bond/probe pads) exhibits a first orientation, wherein probe pad areas 601P, 603P and 605P are located adjacent to the die edge 650. In contrast, a second set of the bond/probe pads 602, 604 and 606 (i.e., the even numbered bond/probe pads) exhibits a second orientation, which is a mirror image of the first orientation along an axis parallel to the die edge 650. In the second orientation, bond pad areas 602B, 604B and 606B are located adjacent to the die edge 650. The first set of bond/probe pads 601, 603 and 605 is interleaved with the second set of bond/probe pads 602, 604 and 606.

Pre-assembly testing is performed by placing probe tips into contact with probe pad areas 601P–606P. The probe tips will typically make contact within the dashed oval areas 621–626 of probe pad areas 601P–606P, respectively. The centers of these oval contact areas 621–626 form a regular (linear) zig-zag pattern, as illustrated by dashed line 631. Each diagonal segment of zig-zag pattern 631 (i.e., the pitch of the probe pad areas) in the example shown has a distance that is approximately equal to 55 microns. This probe pad pitch is greater than the horizontal distance between probe pad areas (e.g., distance D1), in this example by about 20 to 25 percent. Thus, the relatively large pitch between adjacent probe pad areas 601P–606P enables the probe tips of a tester to contact probe pads during testing.

After the testing/probing is complete, the probe tips may have inflicted some surface damage to probe pad areas 601P–606P. Bonding wires are subsequently attached to the pristine bond pad areas 601B–606B, which in this case will not exhibit the same damage as the probe pads. The bonding wires will typically contact bond pad areas 601B–606B within the dashed octagonal areas 611–616, respectively. The centers of octagonal areas 621–626 form a regular (linear) zig-zag pattern, as illustrated by dashed line 632. For a typical bond pad opening of 50 microns, arranged in this format, a zigzag pad pitch 632 of 55 microns is achievable. This translates to a horizontal in-line distance of less than 45 microns. Thus, this bond pad pitch is greater than the horizontal distance between bond pad areas (e.g., distance D1) by about 20 to 25 percent. In the described embodiment, which has a bond pad opening of 50 microns, the distance D1 is equal to about 45 microns. Clearly, a conventional in-line arrangement of rectangular pads having a pitch of 45 microns (see, FIG. 2) cannot have the generous 50 micron bond pad opening provided by the present embodiment of the invention. The relatively large pitch between adjacent bond pad areas 601B–606B enables higher current capacity bond wires to be used for wirebonding. The use of relatively higher diameter wires enables longer wire span wirebonding implementations. The relatively large pad pitch allows bond wires to approach the bond pads at die edge 650 with sufficient clearance between them to improve yields. The relatively large pitch also allows all probe tips to approach the probe pad areas 601P–606P with sufficient clearance with respect to die edge 650. The relatively large pad-to-pad pitch also enables a wider angle of bond approach in which any required minimum wire to wire distance can be maintained. The embodiments described below in connection with FIGS. 7–9 also enable the implementation of a wider approach angle for probe tips and bond wires.

Figure 7:
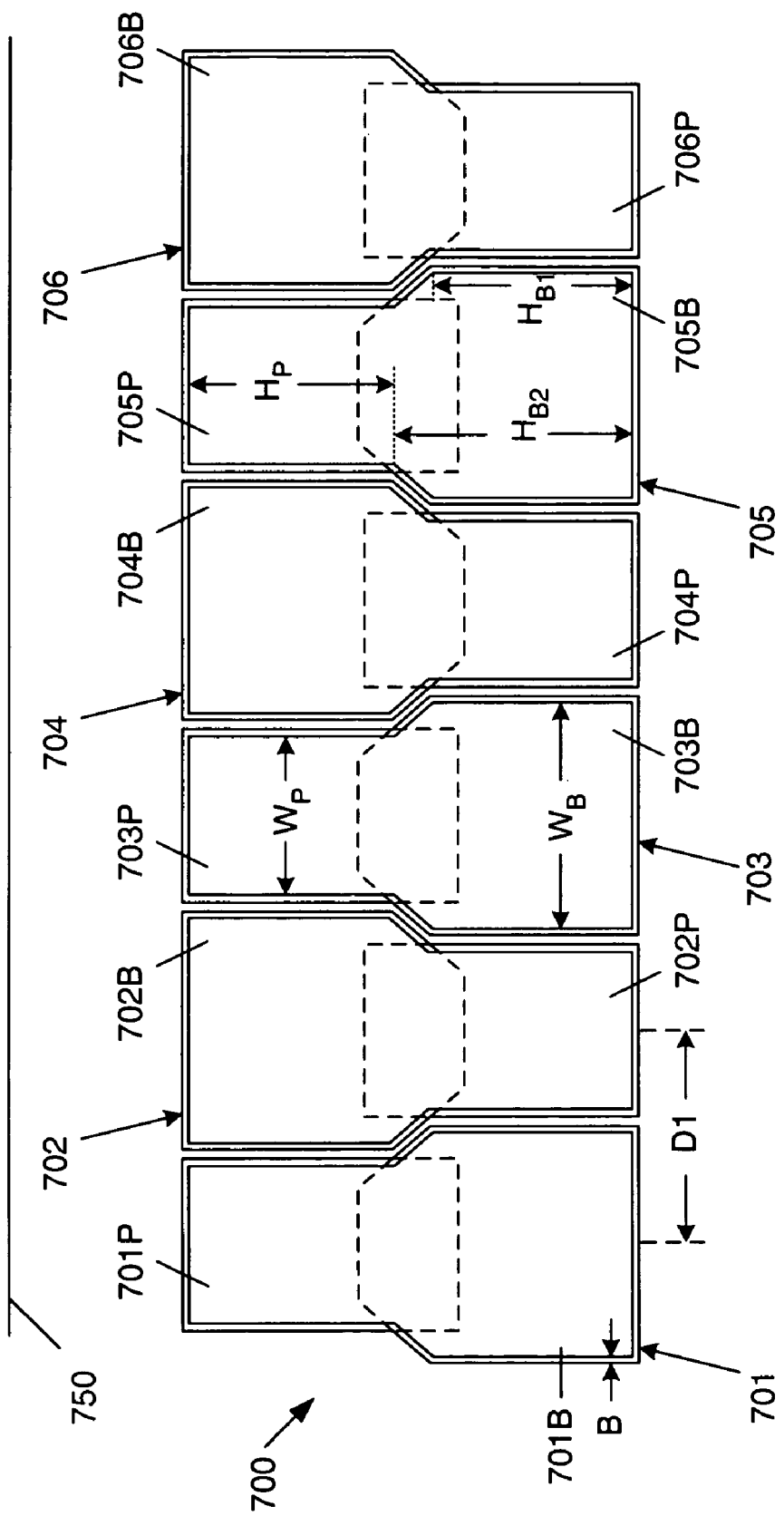
FIG. 7 is a top view of a specific implementation of the pad pattern of FIG. 6.

FIG. 7 is a top view of a pattern 700 of bond/probe pads 701–706, which are located along die edge 750 in accordance with a specific embodiment of the present invention. Each of bond/probe pads 701–706 has an elongated structure that includes an associated bond pad area 701B–706B, respectively, and an associated probe pad area 701P–706P, respectively. Each of bond pad areas 701B–706B is represented by a hexagonal region that includes a rectangular region and a regular trapezoidal region. Each of probe pad areas 701P–706P is represented by a rectangular region. The probe pad areas 701P–706P overlap the bond pad areas 701B–706B as illustrated, such that each of bond/probe pads 701 includes a pair of rectangular areas connected by a regular trapezoidal area. Each of bond/probe pads 701–706 has the same shape, and is formed of a continuous metal layer, such as aluminum or copper. An overlap "B" exists at the perimeter of each of the bond/probe pads 701–706.

Pad pattern 700 can be viewed as a specific implementation of pad pattern 600 (FIG. 6). Thus, bond/probe pads 701–706 are positioned in the interleaved pattern described above in FIG. 6. Bond pad areas 701B–706B are larger than probe pad areas 701P–706P. For example, each of bond pad areas 701B–706B can have a width $W_B$ equal to about 52 microns, a first height $H_{B1}$ equal to about 42 microns, and a second height $H_{B2}$ equal to about 50 microns. Each of probe areas 701P–706P has a width $W_P$ of about 34 microns and a height HP of about 35 microns. In the present embodiment, a substantially uniform spacing of about 2 microns exists between adjacent bond/probe pads 701–706. The effective zigzag bond pad pitch is equal to about 55 microns, representing an increase of about 22 percent over the linear spacing D1. The probe pad pitch is the same as the bond pad pitch.

Advantageously, bond pad areas 701B–706B exhibit a constant width $W_B$ along the entire height $H_{B1}$. Similarly, probe pad areas 701P–706P exhibit a constant width $W_P$ along the entire height $H_P$. These constant widths $W_B$ and $W_P$ ensure adequate bond and probe areas for the minimal periphery area used. The use of the peripheral area is maximized, while reasonably sized openings are maintained for bond and probe.

Although the bond pad areas and probe pad area in the embodiments illustrated by FIGS. 6 and 7 have generally rectangular shapes, it is understood that bond areas and probe areas can have different shapes in different embodiments.

Figure 8:
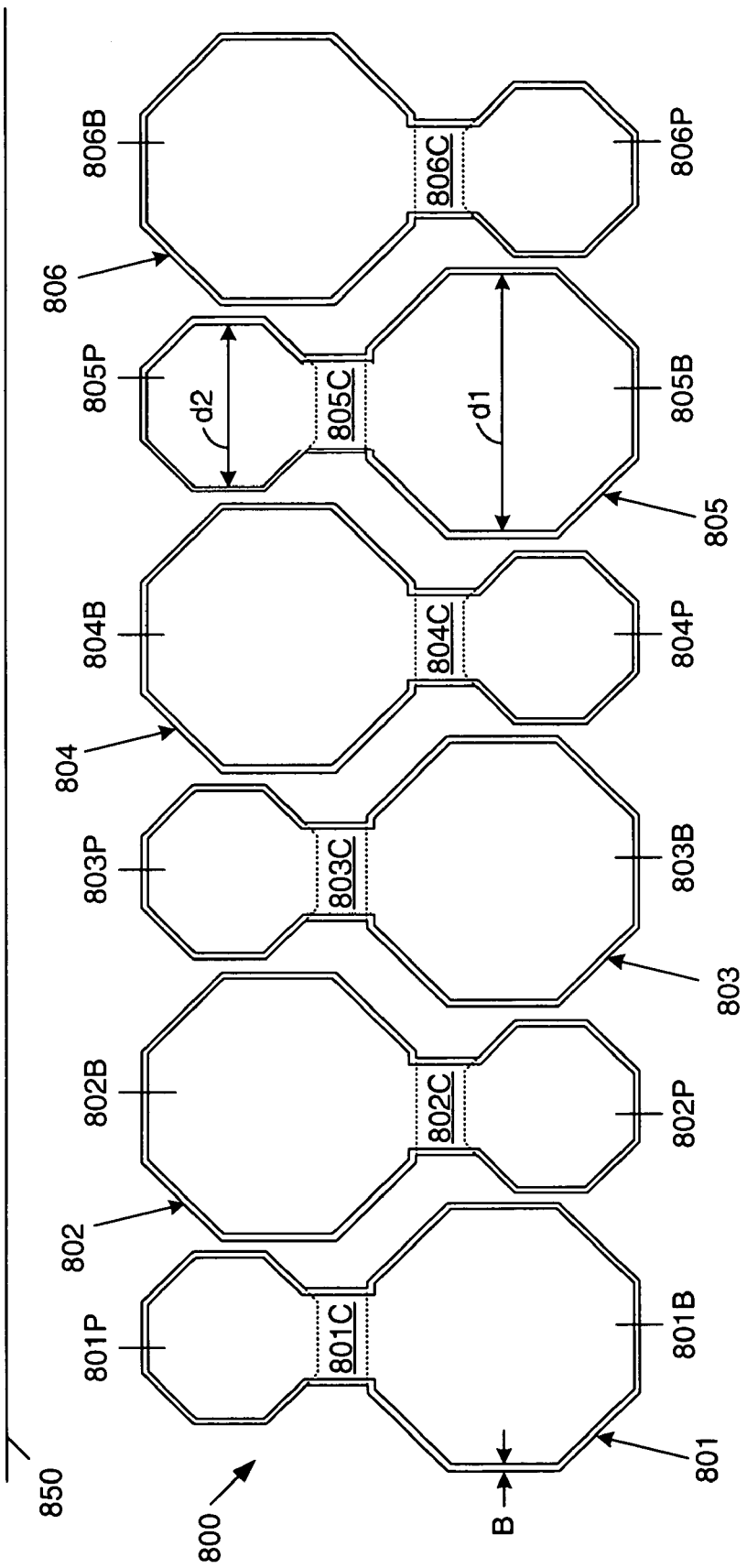
FIG. 8 is a top view of a pattern of elongated bond/probe pads, which implement octagonal bond pad areas and probe pad areas, in accordance with another embodiment of the present invention.

FIG. 8 is a top view of a pattern of elongated bond/probe pads 801–806, which implement octagonal bond pad areas and probe pad areas, in accordance with another embodiment of the present invention. Bond/probe pads 801–806 include octagonal bond pad areas 801B–806B, respectively, and octagonal probe pad areas 801P–806P, respectively. Bond pad areas 801B–806B and probe pad areas 801P–806P are joined by rectangular areas 801C–806C, as illustrated, although other shapes may be used. In another embodiment, rectangular areas 801C–806C are eliminated, and the octagonal bond pad areas are continuous with the associated octagonal probe pad areas. Bond/probe pads 801–806 are located along die edge 850. Bond pad areas 801B–806B are larger than probe pad areas 801P–806P. For example, each of bond pad areas 801B–806B can have a diameter d1 of about 55 microns, and each of probe pad areas 801P–806P can have a diameter d2 of about 35 microns. An overlap "B" exists at the perimeter of each of the bond/probe pads 801–806.

In the described embodiment, each of bond/probe pads 801–806 is formed of a continuous piece of metal, such as aluminum or copper. Bond/probe pads 801–806 all have the same shape. However, the odd bond/probe pads 801, 803 and 805 exhibit a first orientation, with associated probe pad areas located near die edge 850, and the even bond/probe pads 802, 804 and 806 have a second (opposite) orientation, with associated bond pad areas located near die edge 850. Note that non-uniform metal-to-metal spacing exists in pad pattern 800.

In a manner similar to rectangular bond pad areas 701B–706B and rectangular probe pad areas 701P–707P, octagonal bond pad areas 801B–806B and octagonal probe pad areas 801P–806P each exhibit a constant width along a substantial portion of their height.

Figure 9:
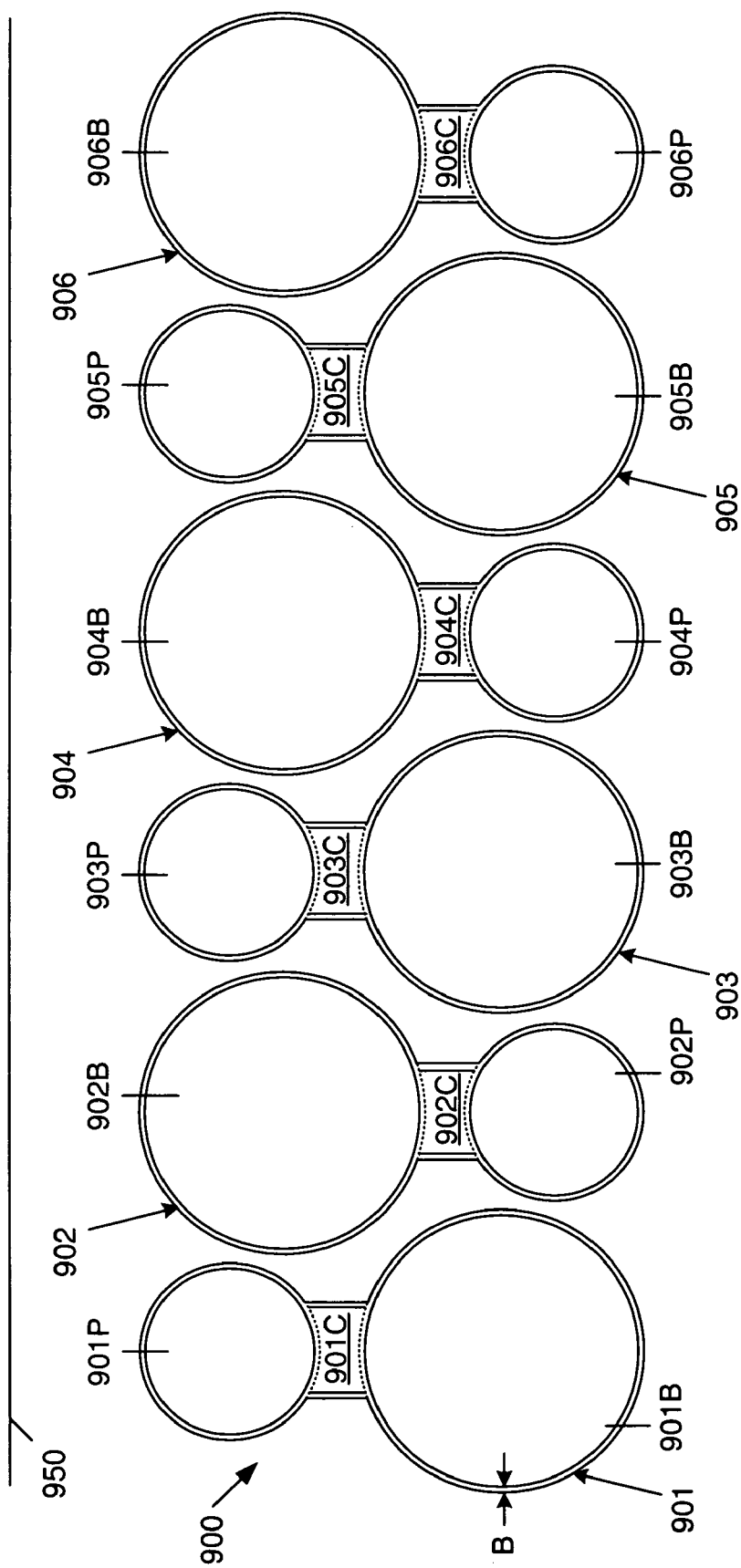
FIG. 9 is a top view of a pattern of elongated bond/probe pads, which implement a near circular bond pad areas and probe pad areas, in accordance with another variation of the present invention.

FIG. 9 is a top view of a pattern of elongated bond/probe pads 901–906, which implement substantially circular bond pad areas and probe pad areas, in accordance with another variation of the present invention. Bond/probe pads 901–906 include circular bond pad areas 901B–906B, respectively, and circular probe pad areas 901P–906P, respectively. Bond pad areas 901B–906B and probe pad areas 901P–906P are joined by areas 901C–906C, which may be rectangular as illustrated. In another embodiment, rectangular areas 901C–906C are eliminated, and the circular bond pad areas are continuous with the associated circular probe pad areas.

Bond/probe pads 901–906 are located along die edge 950. Bond pad areas 901B–906B are larger than probe pad areas 901P–906P. For example, each of bond pad areas 901B–906B can have an area formed by a circle having a diameter of about 50 to 55 microns, and each of probe pad areas 901P–906P can have an area formed by a circle having a diameter of about 34 to 35 microns.

Bond/probe pads 901–906 all have the same shape. Again, the odd bond/probe pads 901, 903 and 905 exhibit a first orientation, with associated probe pad areas located near die edge 950, and the even bond/probe pads 902, 904 and 906 have a second (opposite) orientation, with associated bond pad areas located near die edge 950. Note that non-uniform metal-to-metal spacing exists in pad pattern 900. An overlap "B" exists at the perimeter of each of the bond/probe pads 901–006.

Although the invention has been described in connection with several embodiments, it is understood that this invention is not limited to the embodiments disclosed, but is capable of various modifications, which would be apparent to one of ordinary skill in the art. For example, although the present invention has been described in accordance with patterns of 6 adjacent elongated bond/probe pads, it is understood that this pattern can include other numbers of bond/probe pads in other embodiments. Moreover, although the present invention has been described using specific measurements, it is understood that the present invention may provide an increase in bond pad pitch of about 20 to 25 percent over a linear bond pad configuration, even as the minimum line width of the associated process is reduced. Finally, exemplary overlap is illustrated around the borders of the various bond/probe pads in FIGS. 6–9. Thus, the present invention is only limited by the following claims.

We claim:

1. A pad pattern on a die, the pad pattern comprising:
   a first set of elongated pads, wherein each of the elongated pads includes a bond pad area and a probe pad area, each bond pad area exhibiting a first constant width along a substantial portion of the bond pad area, and each probe pad area exhibiting a second constant width along a substantial portion of the probe pad area, the first constant width being greater than the second constant width, wherein each of the elongated pads in the first set has a first orientation, wherein the bond pad areas and probe pad areas of the first set of elongated pads are octagonal; and
   a second set of elongated pads, wherein each of the elongated pads in the second set includes a bond pad area and a probe pad area, each bond pad area exhibiting a third constant width along a substantial portion of the bond pad area, and each probe pad area exhibiting a fourth constant width along a substantial portion of the probe pad area, the third constant width being greater than the fourth constant width, wherein each of the elongated pads in the second set has a second orientation, the second orientation being opposite the first orientation, and wherein the second set of elongated pads is interleaved with the first set of elongated pads, wherein the bond pad areas and probe pad areas of the second set of elongated pads are octagonal;
   wherein each bond pad area is joined with a corresponding probe pad area by a rectangular area.

2. The pad pattern of claim 1, wherein a substantially uniform spacing exists between the elongated pads of the first set and the elongated pads of the second set.

3. The pad pattern of claim 1, wherein the bond pad areas of the first set of elongated pads are located adjacent to the probe pad areas of the second set of elongated pads, and wherein the probe pad areas of the first set of elongated pads are located adjacent to the bond pad areas of the second set of elongated pads.

4. The pad pattern of claim 1, wherein the bond pad areas of the first and second sets of elongated pads are dimensioned to receive corresponding bond wires.

5. The pad pattern of claim 4, wherein the probe pad areas of the first and second sets of elongated pads are dimensioned to receive corresponding probe tips during testing.

6. The pad pattern of claim 1, wherein the probe pad areas of the first and second sets of elongated pads are dimensioned to receive corresponding probe tips during testing.

7. The pad pattern of claim 1, wherein the pitch between centers of adjacent bonding pad areas is at least about 20% greater than the linear distance between centers of adjacent bonding pad areas, measured along the edge of the die.

8. The pad pattern of claim 1, wherein the first constant width is equal to the third constant width, and the second constant width is equal to the fourth constant width.

9. A pad pattern on a die, the pad pattern comprising:
   a first set of elongated pads, wherein each of the elongated pads includes a circular bond pad area having a first diameter and a circular probe pad area having a second diameter, less than the first diameter, wherein each of the elongated pads in the first set has a first orientation; and
   a second set of elongated pads, wherein each of the elongated pads in the second set includes a circular bond pad area having a third diameter and a probe pad area having a fourth diameter, less than the third diameter, wherein each of the elongated pads in the second set has a second orientation, the second orientation being opposite the first orientation, and wherein the second set of elongated pads is interleaved with the first set of elongated pads;
   wherein the circular bond pad area of each elongated pad of the first and second sets of elongated pads receives a bonding wire; and
   wherein each of the circular bond pad areas is joined to a corresponding one of the circular probe pad areas by a rectangular area.

10. The pad pattern of claim 9, wherein the elongated pads of the first set have a same shape as the elongated pads of the second set.

11. The pad pattern of claim 9, wherein the bond pad areas of the first set of elongated pads are located adjacent to the probe pad areas of the second set of elongated pads, and wherein the probe pad areas of the first set of elongated pads are located adjacent to the bond pad areas of the second set of elongated pads.

12. The pad pattern of claim 9, wherein the pitch between centers of adjacent bonding pad areas is at least about 20% greater than the linear distance between centers of adjacent bonding pad areas, measured along the edge of the die.

13. The pad pattern of claim 9, wherein the first diameter is equal to the third diameter, and the second diameter is equal to the fourth diameter.

\* \* \* \* \*